United States Patent [19]

McDunn et al.

[11] Patent Number: 5,675,473

[45] Date of Patent: Oct. 7, 1997

[54] APPARATUS AND METHOD FOR SHIELDING AN ELECTRONIC MODULE FROM ELECTROMAGNETIC RADIATION

[75] Inventors: Kevin J. McDunn, Lake in the Hills; Linda Limper-Brenner, Glenview; Minoo D. Press, Schaumburg, all of Ill.

[73] Assignee: Motorola, Inc., Schaumburg, Ill.

[21] Appl. No.: 606,316

[22] Filed: Feb. 23, 1996

[51] Int. Cl.⁶ ........................................................ H05K 7/20
[52] U.S. Cl. ...................... 361/699; 165/804; 174/35 R; 174/35 GC; 257/714; 361/818
[58] Field of Search ...................... 165/104.33; 174/35 R, 174/35 GC; 257/714; 361/687–689, 698–703, 816, 818–821

[56] References Cited

U.S. PATENT DOCUMENTS

| | | |
|---|---|---|
| 3,725,566 | 4/1973 | Plizak . |
| 4,399,484 | 8/1983 | Mayer . |
| 4,542,076 | 9/1985 | Bednarz et al. . |
| 4,706,164 | 11/1987 | L'Henaff et al. . |
| 4,711,431 | 12/1987 | Viannay et al. . |
| 4,847,731 | 7/1989 | Smolley . |
| 4,854,377 | 8/1989 | Komoto et al. . |
| 4,884,167 | 11/1989 | Mine . |
| 4,912,600 | 3/1990 | Jaeger et al. .............................. 361/687 |
| 4,935,864 | 6/1990 | Schmidt et al. . |
| 4,945,980 | 8/1990 | Umezawa . |
| 4,964,019 | 10/1990 | Belanger, Jr. . |
| 5,014,777 | 5/1991 | Sano . |
| 5,050,037 | 9/1991 | Yamamoto et al. . |
| 5,057,968 | 10/1991 | Morrison . |
| 5,131,233 | 7/1992 | Cray et al. . |
| 5,166,863 | 11/1992 | Shmunis . |
| 5,174,364 | 12/1992 | Mizuno . |
| 5,175,395 | 12/1992 | Moore . |
| 5,177,666 | 1/1993 | Bland et al. . |
| 5,190,099 | 3/1993 | Mon . |
| 5,204,497 | 4/1993 | Herrick .................................. 361/818 |

(List continued on next page.)

OTHER PUBLICATIONS

M. Ghodbane et al., "Experimental Study of Spray Cooling with Freon–113", Int. J. Heat Mass Transfer, vol. 34, No. 4/5, pp. 1163–1174 (1991).

J.P. Holman et al., "Extended Studies of Spray Cooling with Freon–113", Int. J. Heat Mass Transfer, vol. 36, No. 8, pp. 2239–2241 (1992).

Donald E. Tilton et al., "High–Flux Spray Cooling in a Simulated Multichip Module", HTD–vol. 206–2, Topics in Heat Transfer–vol. 2, ASME (1992).

S.K. Chen et al., "Factors Influencing the Effective Spray Cone Angle of Pressure–Swirl Atomizers", Journal of Engineering for Gas Turbines and Power, vol. 114, pp. 97–103 (Jan. 1992).

Donald Tilton et al., "Advanced Thermal Management for Multichip Modules", Electronic Packaging and production, pp. 71–73 (Aug. 1995).

Kurt A. Estes et al., "Comparison of Two–Phase Electronic Cooling Using Free Jets and Sprays", Journal of Electronic Packaging, vol. 117, pp. 323–332 (Dec. 1995).

Kurt A. Estes et al., "Correlation of Sauter Mean Diameter and Critical Heat Flux for Spray Cooling of Small Surfaces", Int. J. Heat Mass Transfer, vol. 38, No. 16, pp. 2985–2996 (1995).

Primary Examiner—Gregory D. Thompson
Attorney, Agent, or Firm—Heather L. Creps

[57] ABSTRACT

The apparatus includes a cover (10) having a first surface (12) and a second surface (14) opposed to the first surface (12). The second surface (14) has an edge (16) defining a perimeter and has a recessed region (18). A wall (20) is in communication with the recessed region (18), the wall (20) and at least a portion of the edge (16) define a compartment (22). An electromagnetic interference-attenuating material (24) is disposed in the compartment (22), and a fluid distributing manifold (26) is disposed in the cover (10). A nozzle housing (30) sized to receive a nozzle is located in the fluid distributing manifold (26). The nozzle housing (30) has a receptacle end (32) and a spray end (34). The spray end (34) has an aperture (36) in communication with the compartment (22) and the receptacle end (32) is in communication with the fluid distributing manifold (26).

23 Claims, 3 Drawing Sheets

U.S. PATENT DOCUMENTS

| | | |
|---|---|---|
| 5,210,440 | 5/1993 | Long . |
| 5,220,804 | 6/1993 | Tilton et al. . |
| 5,232,164 | 8/1993 | Resch et al. . |
| 5,256,833 | 10/1993 | Schwenk . |
| 5,264,984 | 11/1993 | Akamatsu . |
| 5,270,572 | 12/1993 | Nakajima et al. ............... 361/699 |
| 5,285,351 | 2/1994 | Ikeda . |
| 5,289,363 | 2/1994 | Ferchau et al. . |
| 5,329,419 | 7/1994 | Umezawa . |
| 5,348,076 | 9/1994 | Asakawa . |
| 5,360,993 | 11/1994 | Mine . |
| 5,384,687 | 1/1995 | Sano . |
| 5,388,030 | 2/1995 | Gasser et al. . |
| 5,431,974 | 7/1995 | Pierce . |
| 5,436,501 | 7/1995 | Ikeda . |
| 5,436,793 | 7/1995 | Sanwo et al. . |
| 5,463,528 | 10/1995 | Umezawa . |
| 5,483,423 | 1/1996 | Lewis et al. . |
| 5,491,363 | 2/1996 | Yoshikawa . |

APPARATUS AND METHOD FOR SHIELDING AN ELECTRONIC MODULE FROM ELECTROMAGNETIC RADIATION

FIELD OF THE INVENTION

This invention relates generally to the shielding of electronic modules, and, more particularly, to an apparatus and method for shielding an electronic module from electromagnetic radiation.

BACKGROUND OF THE INVENTION

Heat-generating electronic modules such as multi-chip modules, electronic hybrid assemblies such as power amplifiers and passive components such as filters are susceptible to electromagnetic interference (EMI) during operation. In addition, electronic modules operating in high-frequency environments such as radio frequency communication systems may themselves be sources of undesirable electromagnetic radiation.

EMI generated and received by electronic modules must often be attenuated to keep the modules functioning properly and to bring the modules into compliance with applicable governmental regulations. Electromagnetic radiation may be diverted to ground using protective enclosures such as shields. Shielded electronic modules, like other electronic modules, generally require cooling during operation.

Typically, shielded electronic modules are cooled by natural or forced air convection which, because of relatively poor thermal capacitance and heat transfer coefficients, requires moving large volumes of air through spaces between the module and its shield or past a heavy heat sink attached to the module.

Consequently, air-cooled modules are generally quite large. Further, the air cooling process itself may introduce undesired acoustic noise and contaminants such as dust into the module. Still further, passing air through module shields may require openings in the shields through which not only air but also undesirable electromagnetic radiation may pass.

Evaporative spray cooling features the spraying of atomized liquid droplets directly onto a surface of a heat-producing device such as an electronic module. When the liquid droplets impinge upon the module's surface, a thin liquid film coats the module, and heat is removed primarily by evaporation of the liquid from the module's surface.

Although evaporative spray cooling is a preferred method of heat removal in many electronics applications, known spray cooling systems are not specifically designed to cool EMI-shielded electronic modules.

There is therefore a need for a compact and effective apparatus for spray-cooling an electronic module shielded from electromagnetic radiation.

SUMMARY OF THE INVENTION

According to an aspect of the present invention, the foregoing need is met by an apparatus for shielding an electronic module from electromagnetic radiation which includes a cover having a first surface and a second surface opposed to the first surface. The second surface has an edge defining a perimeter and has a recessed region. A wall is in communication with the recessed region, the wall and at least a portion of the edge define a compartment. An electromagnetic interference-attenuating material is disposed in the compartment, and a fluid distributing manifold is disposed in the cover. A nozzle housing sized to receive a nozzle is located in the fluid distributing manifold. The nozzle housing has a receptacle end and a spray end. The spray end has an aperture in communication with the compartment and the receptacle end is in communication with the fluid distributing manifold.

According to another aspect of the present invention, an apparatus for spray-cooling a shielded electronic module includes a housing having a wall disposed in the housing. The wall defines a first compartment and a second compartment. An electromagnetic interference (EMI)-attenuating material is in communication with the wall. A nozzle is disposed in the first compartment, to receive and atomize a fluid and to discharge the atomized fluid into the first compartment.

According to a further aspect of the present invention, a method for spray-cooling a shielded electronic module includes providing a cover having a first surface and a second surface opposed to the first surface, the second surface having an edge defining a perimeter and having a recessed region, the recessed region having a wall disposed therein, the wall and at least a portion of the edge defining a compartment;

applying an EMI-attenuating material to at least a portion of the compartment; supplying a fluid to a fluid distributing manifold formed in the cover; receiving the fluid by a nozzle disposed in the fluid distributing manifold, the nozzle having a spray end in communication with the compartment and an aperture disposed at a tip of the spray end; atomizing the fluid by the spray end of the nozzle; and discharging the atomized fluid into the compartment via the aperture.

Advantages of the present invention will become readily apparent to those skilled in the art from the following description of the preferred embodiment of the invention which has been shown and described by way of illustration. As will be realized, the invention is capable of other and different embodiments, and its details are capable of modifications in various respects. Accordingly, the drawings and description are to be regarded as illustrative in nature, and not as restrictive.

DETAILED DESCRIPTION OF THE PREFERRED EMBODIMENTS

Figure 1:
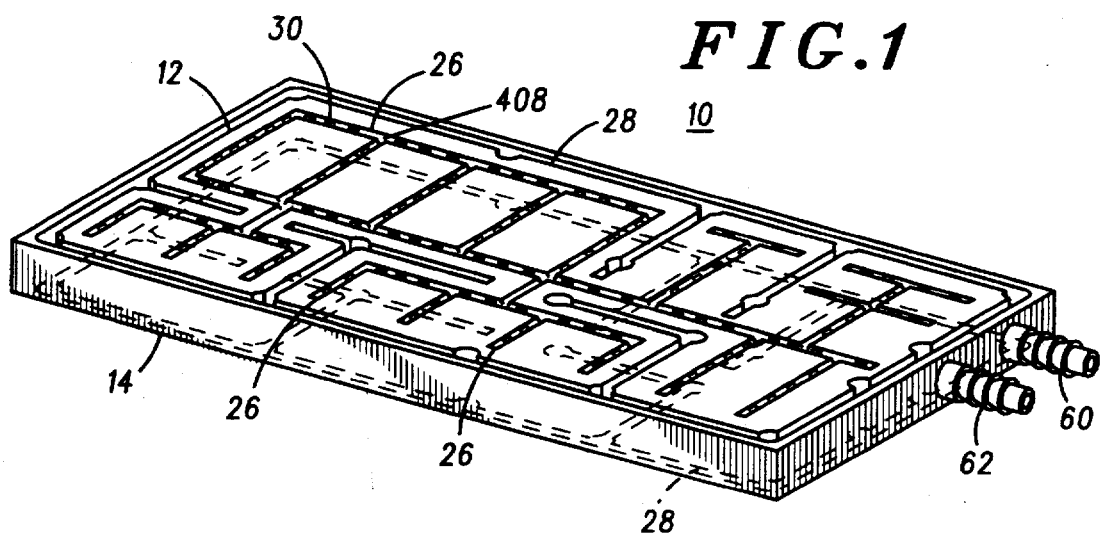
FIG. 1 is a perspective view of a top side of an apparatus for shielding an electronic module from electromagnetic radiation according to a first embodiment of the present invention.
Figure 2:
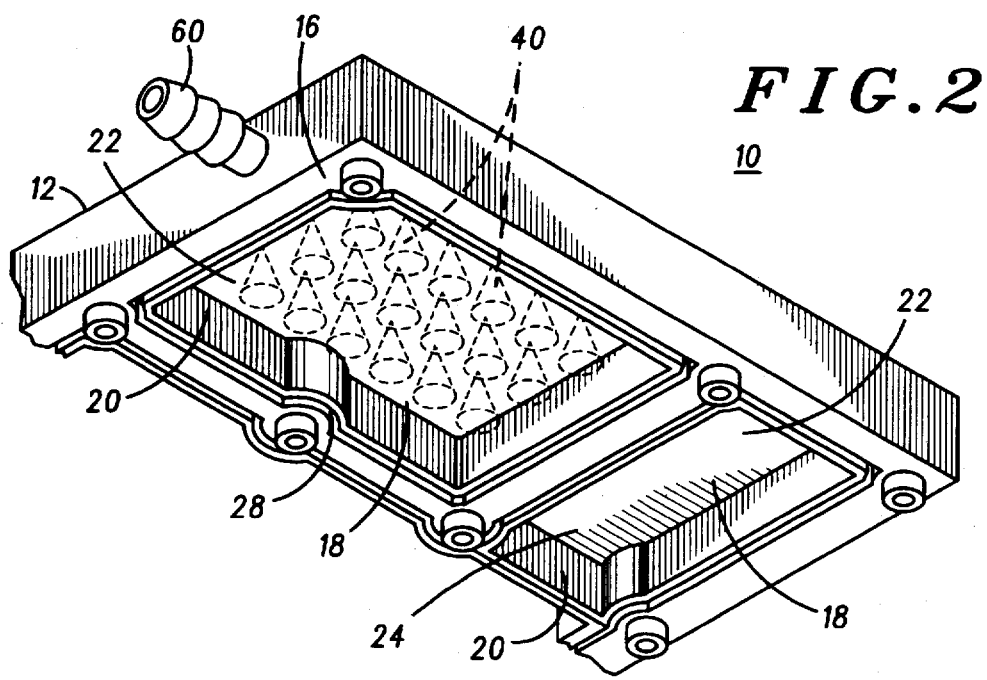
FIG. 2 is a partial perspective view of a bottom side of the apparatus shown in FIG. 1.

Turning now to the drawings, wherein like numerals designate like components, FIGS. 1 and 2 are perspective views of a top and a bottom, respectively, of an apparatus for shielding an electronic module from electromagnetic radiation according to a first embodiment of the present invention. As shown in FIG. 1, a cover 10, which is preferably molded plastic such as a polycarbonate but may be another material such as metal, has a top surface 12 and a bottom surface 14 opposed to top surface 12. As can be seen in FIG. 2, bottom surface 14 has an edge 16 defining a perimeter of bottom surface 14. Bottom surface 14 also has a region 18 which is recessed relative to edge 16.

One or more walls 20 are disposed in, and substantially perpendicular to, recessed region 18 of bottom surface 14. A number of walls 20 are shown. One or more walls 20 and at least a portion of edge 16 define one or more compartments 22. A number of compartments are depicted in FIG. 2. It is contemplated that compartments 22 may be of any geometrical shape. For example, a linear wall extending from one side of recessed region 18 to another side of recessed region 18 and the portions of edges 16 to either side of the linear wall may form two rectangular compartments.

An electromagnetic interference (EMI)-attenuating material 24 such as metal, suitable metals being well-known and widely available, is formed in at least one compartment 22. Carbon, iron and the like may also be used as EMI-attenuating materials. EMI-attenuating material 24 shields compartment 22 to a certain degree from electromagnetic radiation. Compartments 22 treated with EMI-attenuating material 24 surround electronic modules (not shown), so that the electronic modules or parts thereof are isolated (to the extent practicable) from generating or receiving EMI.

After conventionally molding cover 10, metallization of compartments 22 may proceed according to any number of well-known methods, such as compliant conductive material overmolding, vapor-deposition, metal-plating or application of conductive paints. Alternatively, cover 10 may be a composite structure, comprising, for example, a resin and an EMI-attenuating material such as metal, carbon or another suitable material.

Compartments 22 are preferably grounded or otherwise electrically connected to electronic modules to divert undesired electromagnetic radiation to ground. For example, a conductive gasket may be used to provide an electrical connection between compartments 22 and electronic modules.

Referring again to FIG. 1, a number of fluid distributing manifolds 26 are disposed in top surface 12 of cover 10. As shown, each fluid distributing manifold 26 includes a recessed surface 408 which opposes a specific compartment 22. Fluid distributing manifolds 26 of different geometrical cross-sections may be formed in various ways in cover 10. For example, fluid distributing manifolds 26 may have circular, conical or rectangular cross-sections. Manifolds 26 may be grooves formed in top surface 12 of cover 10, or may be separately-formed conduits disposed inside of cover 10.

A fluid collecting conduit 28 which is formed from a number of interconnected fluid paths may also be disposed in cover 10. Fluid collecting conduit 28 connects top surface 12 and bottom surface 14 of cover 10, and is preferably located adjacent to at least a portion of a perimeter of each compartment 22.

At least one nozzle housing 30 is disposed in each fluid distributing manifold 26. As shown in detail in FIG. 3, nozzle housing 30 has a receptacle end 32 which is disposed on a fluid distributing manifold (shown in FIG. 1). A spray end 34 of nozzle housing 30 is in communication with a compartment 22 (shown in FIG. 2), and includes an aperture 36, on the order of 0.15 mm in diameter.

Each nozzle housing 30 is sized to receive a nozzle 500. It is contemplated that a nozzle is secured to a nozzle housing 30 by, for example, press-fitting, soldering or bonding. Alternatively, a nozzle may be integrally formed in each fluid distributing manifold.

Nozzles are preferably miniature atomizers such as simplex pressure-swirl atomizers, which are approximately 0.3 mm high and which may be made of any suitable material. An example of a suitable material is a metallic material such as brass. Simplex pressure-swirl atomizers are described in detail in U.S. Pat. No. 5,220,804 to Tilton et al., incorporated herein by reference, and are commercially available from Isothermal Systems Research, Inc., located in Colton, Wash.

Figure 3:
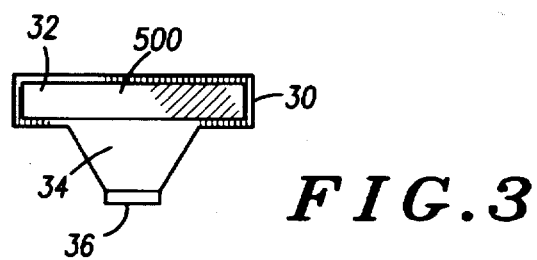
FIG. 3 is a side view of a nozzle housing for spray-cooling a shielded electronic module as shown in FIGS. 1 and 2.

During normal operation of the first embodiment of the apparatus described herein, referring collectively to FIGS. 1, 2 and 3, each fluid distributing manifold 26 receives a coolant (not shown) from fluid inlet port 60 and supplies the coolant to receptacle end 32 of one or more nozzle housings 30 which are fitted with nozzles (not shown). The nozzles atomize the coolant and discharge the atomized fluid 40 through aperture 36 into one or more compartments 22 opposing fluid distributing manifolds 26. Fluid 40 may be discharged from aperture 36 at a substantially perpendicular angle to recessed region 18, collected via the action of negative pressure by fluid collecting conduit 28 (discussed further in connection with FIG. 4) and removed via fluid outlet port 62.

The coolant is preferably Fluorinert™, available from 3M, order number FC-72, but may be another suitable dielectric coolant, such liquids being well-known and widely available. For example, a perfluorocarbon liquid chemically similar to Fluorinert™ is available from Ausimont Galden®.

Thus, electronic modules shielded from EMI by compartments 22 are individually spray-cooled according to each module's needs. An electronic module located in a compartment 22 having a power density of up to three-hundred Watts per square centimeter is effectively cooled. The removal of heat directly from individual electronic modules helps to reduce operating temperatures of the modules and their associated components, increasing reliability through elimination of thermal variation and associated thermal stresses.

Holes which may pass undesirable electromagnetic radiation in air-cooled systems are eliminated. Fluid inlet and outlet ports 60, 62, unlike air holes, are remotely locatable from electronic modules, and have very small diameters relative to their lengths. Thus, high frequency electromagnetic waves which would contribute to EMI are significantly reduced.

Large spacing constraints between an EMI shield and an electronic module present in an air-cooled system are virtually non-existent in the spray-cooled apparatus described herein. Cover 10 may be placed as close to a surface of an electronic module as the heights of components attached to the module will allow, resulting in compact module packaging. And unlike air cooling, which is most effective when heat is spread over a large area, for example, a large heat sink, spray cooling encourages heat concentration, another factor contributing to reduced package volume and weight.

Figure 4:
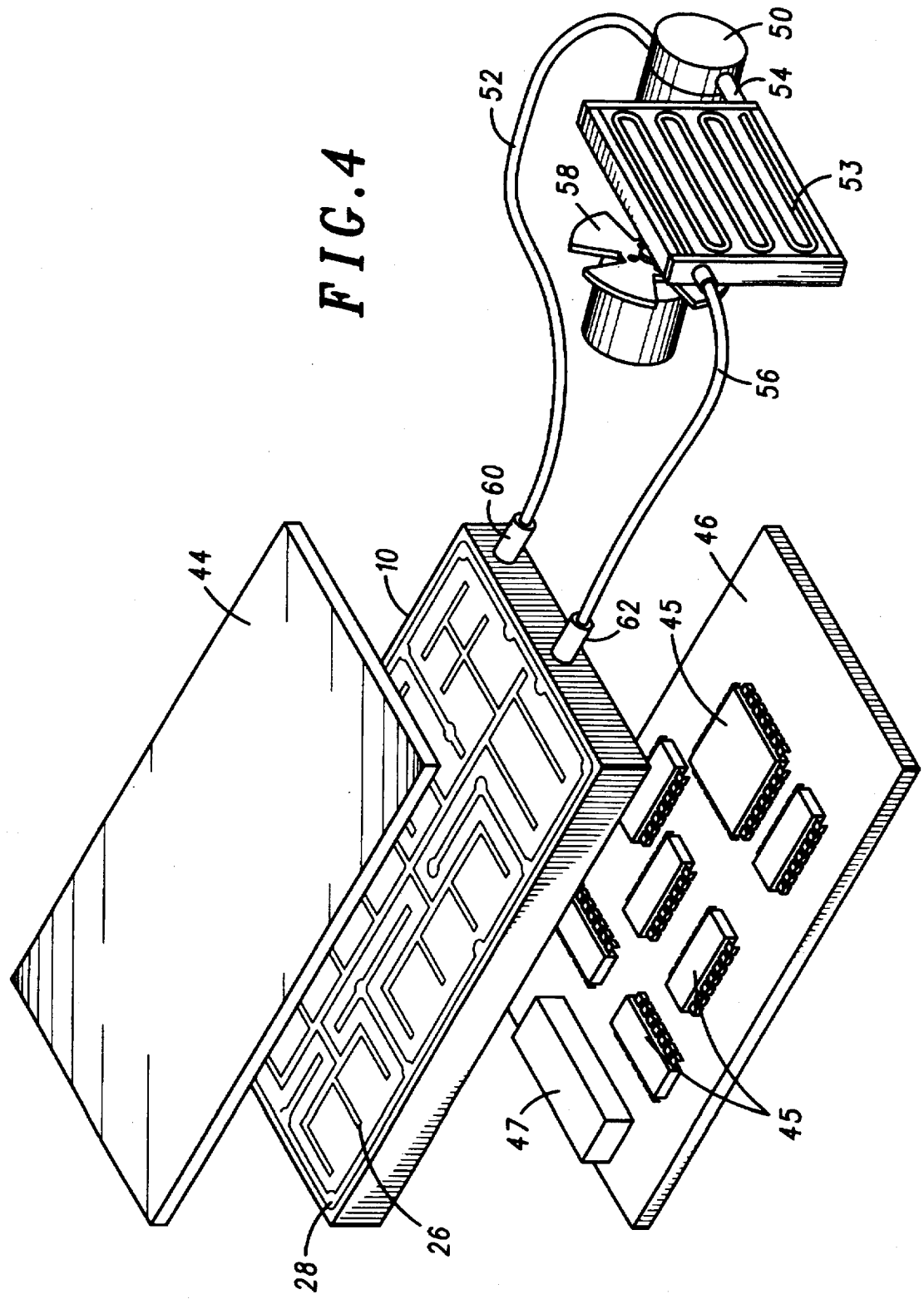
FIG. 4 is an expanded perspective view illustrating a closed loop fluid flow for the apparatus shown in FIGS. 1 and 2.

Referring to FIG. 4, which illustrates a closed loop fluid flow for the apparatus shown in FIGS. 1 and 2, a plate 44 may be attached and sealed to top surface 12 of cover 10. Alternatively, it may be desirable to utilize gas-assist injection molding to manufacture plate 44 and cover 10 as an integral part, forming internal voids during the molding process. It is also contemplated that instead of plate 44, a fluid supply manifold (discussed in connection with FIG. 5) may be attached and sealed to a perimeter of top surface Another plate 46, which may be, among other things, a printed circuit board, has one or more electronic modules 45 attached thereto. Plate 46 is fastened to at least a portion of edge 16 (shown in FIG. 2) by any suitable means. Electronic modules 45 (or parts thereof) on plate 46 are positioned so that a compartment 22 (shown in FIG. 2), which has been treated with, or is in part comprised of, an EMI-attenuating material, surrounds one or more modules 45.

As shown, a connector 47 provides electrical connections for electronic modules 45. Shielded modules 45 on plate 46 may be placed in a rack-type housing such as a Versa Module Europe (VME) cage or an Electronic Industries Association (EIA) sub-rack (or another type of housing) and may be connected to other modules.

During normal operation, a fluid pump 50, which is connected via tube 52 to a fluid inlet port 60 disposed on cover 10, supplies a coolant fluid to fluid distributing manifolds 26. It will be appreciated, however, that where a fluid supply manifold (discussed in connection with FIG. 5) is used in lieu of plate fluid inlet port 60 could be disposed on the fluid supply manifold and then connected via tube 52 to fluid pump 50.

After fluid is atomized and discharged into compartments 22 as described above, fluid collecting conduit 28, which forms a continuous channel in cover 10, receives fluid from compartments 22 principally by the action of negative pressure difference. A condenser 53, connected to pump 50 by tube 54 and to a fluid outlet port 62 by tube 56, receives fluid from fluid collecting conduit 28. Condenser 53 rejects heat from the fluid, reducing the fluid's temperature and returning it to primarily a liquid phase. Fan 48 may optionally be used to extend the cooling capacity of condenser 53. Cooled fluid is supplied from condenser 53 to fluid inlet port 60. Thus, a closed-loop flow of coolant is formed. It will be appreciated that at any given point the coolant may be a vapor, a liquid or a vapor and liquid mixture.

It is contemplated that any conventional means for providing flow of a coolant may be used in conjunction with the described embodiments of the present invention, and that more than one cover 10 may be connected to a single source of coolant or that one or more sources of coolant may be connected to a single cover 10. Alternatively, one or more closed loop fluid flow systems may be housed in cover 10, in a specialized compartment, for example.

The size of fluid pump 50, condenser 53 and fan 58 should be selected based on heat removal and flow rate requirements. For example, a typical closed loop fluid flow is 500 to 1000 milliliters per minute for 500 to 1000 Watts of heat dissipation. Pump and condenser assemblies in various sizes are available from Isothermal Systems Research, Inc., and acceptable tubing and fittings may be obtained from Cole-Parmer in Vernon Hills, Ill.

It is further contemplated that wherever sealing and/or fastening may be required, numerous methods and materials may be used. For example, fasteners, compliant gaskets, ultrasonic welding, brazing, soldering or swaging may be utilized.

The closed loop fluid flow system described herein has many advantages. For example, it does not require routing and managing a multitude of fluid supply and discharge lines nor does it involve positioning and repositioning spray nozzles to cool different modules. Consequently, despite the increase in heat density as circuits are further integrated and physical space on and between electronic modules in shielded assemblies is reduced, the spray cooling assembly described herein will not increase in size, weight or complexity.

The simplicity of the system also enhances its serviceability. For example, repairing the spray cooling system does not involve disconnecting and repositioning numerous fluid lines, so that leakage potential of the system is decreased. Likewise, the system design provides for unobstructed access to individual electronic modules when the shielding cover is removed, facilitating removal and replacement of the modules.

Figure 5:
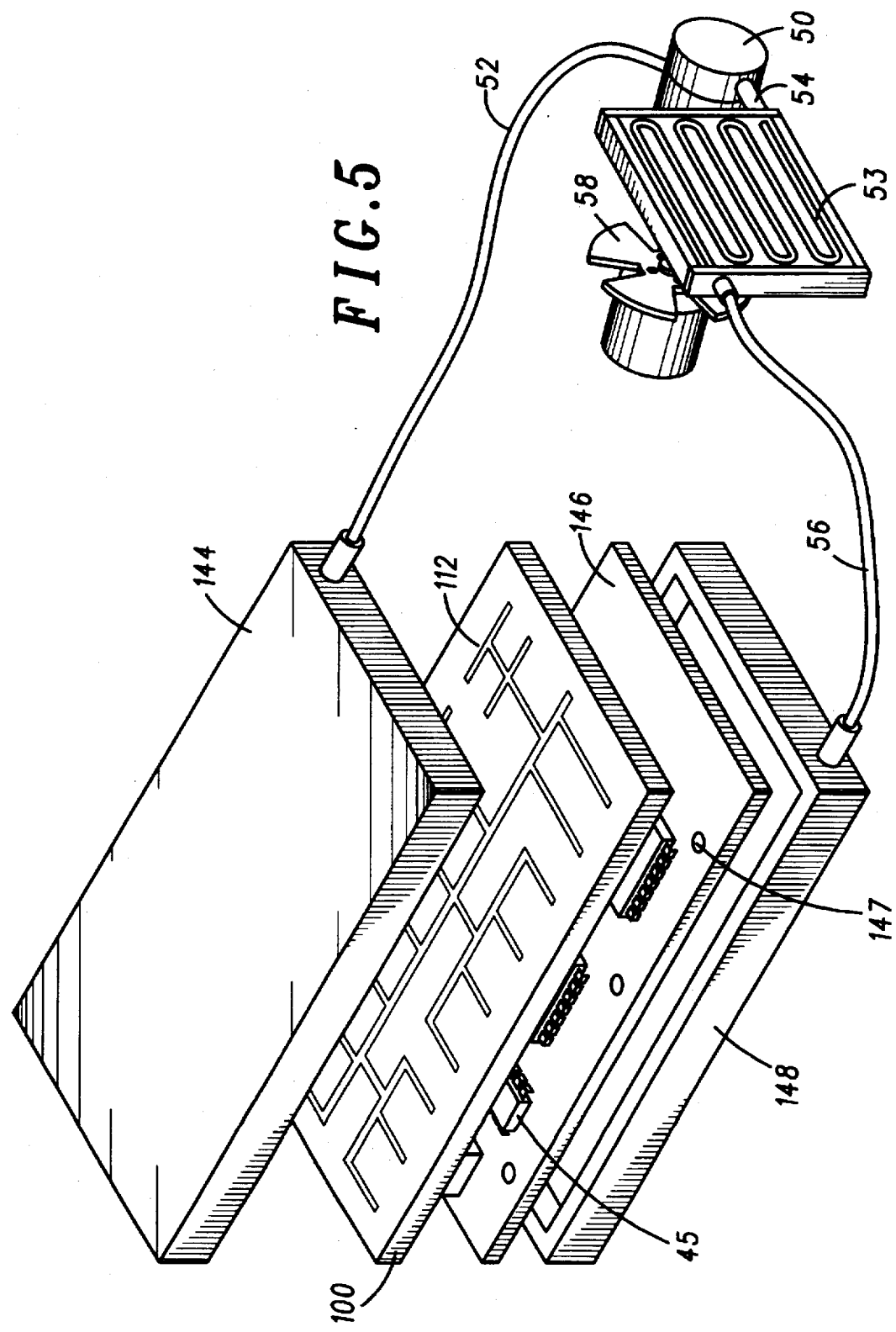
FIG. 5 is a perspective view of an apparatus for shielding an electronic module from electromagnetic radiation according to a second embodiment of the present invention.

FIG. 5 illustrates an apparatus for spray-cooling a shielded electronic module according to a second embodiment of the present invention. Cover 100 is identical to cover 10 described in connection with the first embodiment, except that a top surface 112 of cover 100 does not include a fluid collecting conduit (shown in FIGS. 1 and 2).

A plate 146 is fastened to at least a portion of cover 100. Plate 146, which may be, among other things, a printed circuit board, has a number of orifices 147 therein, and has one or more electronic modules 45 attached thereto. Electronic modules 45 may be affixed to both sides of plate Electronic modules 45 on plate 146 which face cover 100 are positioned so that compartments (discussed in connection with FIG. 2) which have been treated with an EMI-attenuating material surround each module which requires shielding.

A fluid supply manifold 144 defining a reservoir (not shown) is attached and sealed to top surface 12 of cover 100. Fluid supply manifold 144 receives a coolant from tube 52 and supplies the coolant to a plurality of fluid distributing manifolds 26. Alternatively, a plate (such as plate 44 described in connection with FIG. 4) may be attached and sealed to top surface 112 of cover 100, in which case the coolant would be supplied to the fluid distributing manifolds 26 via a fluid inlet port (such as fluid inlet port 60 discussed in connection with FIG. 4) attached directly to cover 100.

A fluid discharge manifold 148 may be attached and sealed to a bottom surface of cover 100. Fluid discharge manifold 148 collects the coolant from cover 100 via orifices 147 in plate 146 and removes the coolant via tube 56.

Where electronic modules 45 are located on a side of plate 146 facing away from cover 100 (not shown), fluid discharge manifold 148 may be, for example, another cover similar to cover 100. Such a cover would provide, along with fluid removal, EMI-shielding and/or spray-cooling to the heat-producing electronic components on the side of plate 146 facing away from cover 100. It is contemplated that removal of fluid in this case is aided by gravity.

It is contemplated that the same or similar means for providing a closed loop flow of coolant may be used in conjunction with the second embodiment of the present invention as was described in connection with the first embodiment.

The embodiment of the spray-cooling apparatus depicted in FIG. 5 shares the heat removal and packaging advantages realized by the spray cooling apparatus shown in FIGS. 1, 2 and 4. Thus, spacing between the cover and the electronic modules it shields is essentially governed by maximum component height, not by the requirements of the cooling system. In addition, cover 100 is compact and portable. Thus, assembly is efficient, serviceability and replacement are simplified, and precise heat source-to-nozzle registration may be obtained.

It will be understood that while the embodiments described show electronic modules being cooled during normal operation, the present invention is not limited only to cooling during ordinary operation of the electronic modules, but may be adapted to, for example, testing and evaluation of the electronic modules or the electronic circuit devices included in the modules.

It will also be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

We claim:

1. An apparatus for shielding an electronic module from electromagnetic radiation, the apparatus comprising:
    a cover having a first surface and a second surface opposed to the first surface, the second surface having an edge defining a perimeter and having a recessed region;

a wall in communication with the recessed region, the wall and at least a portion of the edge defining a compartment;

an electromagnetic interference-attenuating material disposed in the compartment;

a fluid distributing manifold disposed in the cover; and a nozzle housing in the fluid distributing manifold, the nozzle housing sized to receive a nozzle, and having a receptacle end and a spray end, the spray end having an aperture, the receptacle end in communication with the fluid distributing manifold and the spray end in communication with the compartment.

2. The apparatus according to claim 1, further comprising:

a first plate having an electronic module attached thereto, at least a portion of the electronic module disposed within the compartment.

3. The apparatus according to claim 2, wherein the electronic module is selected from the group consisting of: a passive component, a multi-chip module, and an electronic hybrid assembly.

4. The apparatus according to claim 2, wherein the first plate comprises a printed circuit board.

5. The apparatus according to claim 2, wherein the first plate has a plurality of orifices therethrough.

6. The apparatus according to claim 5, further comprising:

a fluid discharge manifold in communication with at least a portion of the edge, the fluid discharge manifold collecting a fluid from the plurality of orifices.

7. The apparatus according to claim 1, further comprising:

a fluid collecting conduit disposed in the cover adjacent to at least a portion of a perimeter of the compartment, the fluid collecting conduit connecting the first surface and the second surface.

8. The apparatus according to claim 7, further comprising:

a fluid inlet port disposed in the cover, the fluid inlet port supplying a fluid to the fluid distributing manifold; and a fluid outlet port disposed in the cover, the fluid outlet port removing the fluid from the fluid collecting conduit.

9. The apparatus according to claim 8, further comprising:

a fluid pump in communication with the fluid inlet port; and a condenser in communication with the fluid pump and with the fluid outlet port, the condenser receiving the fluid from the fluid outlet port and supplying the fluid to the fluid inlet port, forming a closed loop fluid flow.

10. The apparatus according to claim 1, further comprising:

a fluid supply manifold in communication with the first surface, the fluid supply manifold supplying a fluid to the fluid distributing manifold.

11. The apparatus according to claim 1, further comprising:

a second plate in communication with substantially all of the first surface to reduce fluid leakage from the fluid distributing manifold.

12. The apparatus according to claim 1, wherein the nozzle is press-fit into the nozzle housing.

13. The apparatus according to claim 1, wherein the nozzle is welded to the nozzle housing.

14. The apparatus according to claim 1, wherein the nozzle comprises brass.

15. The apparatus according to claim 1, wherein the nozzle discharges an atomized fluid through the aperture at an angle to the recessed region.

16. The apparatus according to claim 1, wherein the cover comprises plastic.

17. The apparatus according to claim 1, wherein the electromagnetic wave-attenuating material comprises metal.

18. The apparatus according to claim 1, wherein a cross-section of the fluid distributing manifold is selected from the group consisting of: circular, conical and rectangular.

19. The apparatus according to claim 1, wherein the wall is substantially perpendicular to the recessed region.

20. The apparatus according to claim 1, wherein the electromagnetic interference-attenuating material is a composite part of the compartment.

21. The apparatus according to claim 1, wherein the compartment is in electrical communication with an electronic module.

22. An apparatus for shielding an electronic module from electromagnetic radiation, the apparatus comprising:

a cover, the cover having a first surface and a second surface opposed to the first surface, the second surface having an edge defining a perimeter and having a recessed region relative to the edge;

a wall disposed in the recessed region and substantially perpendicular thereto, the wall and at least a portion of the edge defining a compartment;

an EMI-attenuating material formed in the compartment to at least partially shield the compartment from electromagnetic radiation;

a plurality of fluid distributing manifolds formed in the first surface, each fluid distributing manifold having a recessed surface opposing the compartment;

a fluid collecting conduit formed in the cover adjacent to at least a portion of a perimeter of the compartment, the fluid collecting conduit connecting the first surface and the second surface; and a plurality of nozzles formed in the recessed surface of each fluid distributing manifold, each nozzle having a receptacle end and a spray end, the spray end having an aperture, the receptacle end being in communication with the recessed surface and the spray end being in communication with the compartment, the receptacle end of each nozzle receiving a fluid from one of the plurality of fluid distributing manifolds, the spray end of each nozzle atomizing the fluid and discharging the atomized fluid through the aperture into the compartment, the fluid collecting conduit removing the fluid from the compartment.

23. A method for spray-cooling a shielded electronic module, the method comprising:

providing a cover having a first surface and a second surface opposed to the first surface, the second surface having an edge defining a perimeter and having a recessed region, the recessed region having a wall disposed therein, the wall and at least a portion of the edge defining a compartment;

applying an EMI-attenuating material to at least a portion of the compartment;

supplying a fluid to a fluid distributing manifold formed in the cover;

receiving the fluid by a nozzle disposed in the fluid distributing manifold, the nozzle having a spray end in communication with the compartment and an aperture disposed at a tip of the spray end;

atomizing the fluid by the spray end of the nozzle; and discharging the atomized fluid into the compartment via the aperture.

* * * * *